(12) United States Patent
Trueheart et al.

(10) Patent No.: US 8,552,782 B1
(45) Date of Patent: Oct. 8, 2013

(54) QUADRATURE PHASE NETWORK

(75) Inventors: William G. Trueheart, Sewell, NJ (US); Brandon R. Davis, Mount Laurel, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 13 days.

(21) Appl. No.: 13/307,930

(22) Filed: Nov. 30, 2011

Related U.S. Application Data

(60) Provisional application No. 61/418,202, filed on Nov. 30, 2010.

(51) Int. Cl.
*H03H 11/16* (2006.01)

(52) U.S. Cl.
USPC ........................................... 327/254; 327/231

(58) Field of Classification Search
None
See application file for complete search history.

(56) References Cited

U.S. PATENT DOCUMENTS

| | | | | |
|---|---|---|---|---|
| 6,696,885 | B2 * | 2/2004 | Christensen | 327/552 |
| 6,831,497 | B2 * | 12/2004 | Koh et al. | 327/254 |
| 7,756,219 | B2 * | 7/2010 | Beyer et al. | 375/309 |
| 7,978,785 | B2 * | 7/2011 | Leifso | 375/302 |

* cited by examiner

*Primary Examiner* — Cassandra Cox
(74) *Attorney, Agent, or Firm* — Howard IP Law Group, PC

(57) ABSTRACT

A phase shifter comprises a differential quadrature all-pass filter (QAF) including a balanced input port and two balanced output ports. A quadrature phase shift is manifested between the balanced output ports. The phase shifter also comprises a resistance-capacitance polyphase filter (PPF) section defining two balanced input ports and two balanced output ports. The balanced input ports of the PPF are coupled to the balanced output ports of the QAF. The combination exhibits broad bandwidth and relatively low ohmic loss.

8 Claims, 3 Drawing Sheets

US 8,552,782 B1

QUADRATURE PHASE NETWORK

CROSS-REFERENCE TO RELATED APPLICATIONS

This application claims benefit under 35 USC 119(e) of the priority date of Provisional application Ser. No. 61/418,202, filed Nov. 30, 2010 the subject matter of which is incorporated by reference herein in its entirety.

BACKGROUND OF THE INVENTION

Quadrature phase-shifting networks are widely used in electronic systems. Very often, the overall bandwidth of the electronic system will depend upon the bandwidth of the quadrature phase-shifting network.

One well-known type of quadrature phase-shifting network is the coupled transmission line, which includes two quarter-wavelength unbalanced transmission lines, the "center" conductors of which are placed in physical proximity so as to provide coupling. Such coupled transmission-line phase shifters have a bandwidth in the range of ten percent.

Many modern electronic systems are desirably implemented in the form of monolithic integrated circuits. As such, the phase shifters must provide the desired phase shift while defined on, or as part of, a monolithic integrated circuit. Such integrated circuits may have substrates made from semiconductor material, such as silicon. Semiconductor, when used as a substrate for passive electronic components, such as capacitors or inductors, tends to introduce attenuation or ohmic losses, which undesirably affect the operation.

There are two other well-known types of quadrature phase shifter in addition to the coupled-transmission-line quadrature phase shifters. These include the all-pass filter and the polyphase network. FIG. 1 illustrates a prototype or single stage of the all-pass phase-shifting network 10. In FIG. 1, an all-pass phase shifting network 10 includes a balanced two-conductor "input" port 12 with two nodes or terminals $12_1$ and $12_2$. A pair 16 of non-coupled inductors includes inductor elements $16_1$ and $16_2$. Inductor element $16_1$ defines first and second terminals $16_{11}$ and $16_{12}$. Inductor element $16_2$ defines first and second terminals $16_{21}$ and $16_{22}$. Terminal $16_{11}$ of inductor element $16_1$ is connected to terminal $12_1$, and terminal $16_{22}$ of inductor element $16_2$ is connected to terminal $12_2$. All-pass phase shifting network 10 of FIG. 1 also includes a further pair of balanced "output" ports $14_1$ and $14_2$ of a set 14 of output ports. Output port $14_1$ defines I+ and I− terminals $14_{11}$ and $14_{12}$, respectively, and output port $14_2$ defines Q− and Q+ terminals $14_{21}$ and $14_{22}$, respectively. Terminal $16_{12}$ of inductor element $16_1$ is connected by way of a conductive path $20_2$ to terminal $14_{22}$, and terminal $16_{21}$ of inductor element $16_2$ is connected by way of a conductive path $20_1$ to terminal $14_{21}$. A capacitor $18_1$ is connected "between" terminals $12_1$ and $14_{11}$, and a capacitor $18_2$ is connected between terminals $12_2$ and $14_{12}$. A resistor $22_1$ is connected "between" terminals $14_{11}$ and $14_{21}$, and a resistor $22_2$ is connected between terminals $14_{12}$ and $14_{22}$.

The mutually 90° phase shifted signals appear at output ports $14_1$ and $14_2$. More particularly, with respect to FIG. 1, the output I+ at terminal $14_{11}$ represents zero (0) degree phase shift. The output I− at terminal $14_{12}$ represents −180 degree phase shift. The output Q+ at terminal $14_{22}$ represents −90 degree phase shift. And the output Q− at terminal $14_{22}$ represents −270 degree phase shift. Such a single stage of differential quadrature all-pass filter exhibits a bandwidth of about 2:1, and a through loss or attenuation of about five (5) dB. It should be noted that the loss of 5 dB is attributable to both ohmic or heat losses and to power division. That is, the applied power is divided among two output ports, so the power available at any given output port will in theory be only one-half of the applied power. This corresponds to a theoretical loss of 3 dB regardless of the efficiency of the circuit.

It should be noted that the terms "between," "across," and other terms such as "parallel" have meanings in an electrical context which differ from their meanings in the field of mechanics or in ordinary parlance. More particularly, the term "between" in the context of signal or electrical flow relating to two separate devices, apparatuses or entities does not relate to physical location, but instead refers to the identities of the source and destination of the flow. Thus, flow of signal "between" A and B refers to source and destination locations, and the flow itself may be by way of a path which is nowhere physically located between the locations of A and B. The term "between" can also define the end points of the electrical field extending "across" or to points of differing voltage or potential, and the electrical conductors making the connection need not necessarily lie physically between the terminals of the source. Similarly, the term "parallel" in an electrical context can mean, for digital signals, the simultaneous generation on separate signal or conductive paths of plural individual signals, which taken together constitute the entire signal. For the case of current, the term "parallel" means that the flow of a current is divided to flow in a plurality of separated conductors, all of which are physically connected together at disparate, spatially separated locations, so that the current travels from one such location to the other by plural paths, which need not be physically parallel.

In addition, discussions of circuits necessarily describe one element at a time, as language is understood in serial time. Consequently, a description of two interconnected elements may describe them as being in "series" or in "parallel," which may be true for the two elements described. However, further description of the circuit may implicate other interconnected devices, which when connected to the first two devices may result in current flows which contradict the "series" or "parallel" description of the original two devices. This is an unfortunate result of the limitations of language, and all descriptions herein should be understood in that context.

Also, the term "coupled" as used herein includes electrical activity extending from one element to another element either by way of an intermediary element or in the absence of any intermediary element.

The terms "input" and "output" in the case of passive networks such as those of FIG. 1 are for ease of identification and are not necessarily descriptive of the use, as such networks are "reciprocal," in that their actions are independent of the direction of energy flow therethrough.

FIG. 2A illustrates a prototype of a single-pole polyphase filter 210, and FIG. 2B illustrates a prototype of a double-pole polyphase filter 250. In FIG. 2A, single-pole polyphase filter 210 includes a balanced input port 212 including input + terminal $212_1$ and − terminal $212_2$, and output ports $214_1$ and $214_2$. Output port $214_1$ defines I+ terminal $214_{11}$ and I− terminal $214_{12}$, and output port $214_2$ defines Q+ terminal $214_{21}$ and Q− terminal $214_{22}$. A resistor $222_1$ is connected between terminals $212_1$ and $214_{11}$. A resistor $222_2$ is connected between terminals $212_1$ and $214_{21}$, a resistor $222_3$ is connected between terminals $212_2$ and $214_{12}$, and a resistor $222_4$ is connected between terminals $212_2$ and $214_{22}$. Also, a capacitor $218_1$ is connected between terminals $212_1$ and $214_{21}$, a capacitor $218_2$ is connected between terminals $212_1$ and $214_{12}$, a capacitor $218_3$ is connected between terminals $212_2$ and $214_{22}$, and a capacitor $218_4$ is connected between terminals $212_2$ and $214_{11}$.

The single-pole arrangement of FIG. 2A provides quadrature phase shift between ports $214_1$ and $214_2$, but with relatively limited bandwidth because of its single-stage nature. More particularly, with respect to FIG. 2A, the output I+ at terminal $214_{11}$ represents zero (0) degree phase shift. The output I− at terminal $214_{12}$ represents +180 degree phase shift. The output Q+ at terminal $214_{21}$ represents +90 degree phase shift. And the output Q− at terminal $214_{22}$ represents +270 degree phase shift.

The multistage filter 250 of FIG. 2B provides greater bandwidth than the single-stage filter 210 of FIG. 2A. Filter 250 of FIG. 2B includes a balanced input port 252 with + terminal $252_1$ and − terminal $252_2$, and balanced output ports $254_1$ and $254_2$. Output port $254_1$ includes I+ terminal $254_{11}$ and I− terminal $254_{12}$, and output port $254_2$ includes Q+ terminal $254_{21}$ and Q− terminal, $254_{22}$. A resistor $272_1$ of a set 272 of resistors extends, or is coupled, from terminal $252_1$ to a node $280_1$, a resistor $272_2$ extends from terminal $252_1$ to a node $280_2$, a resistor $272_3$ extends from terminal $252_2$ to a node $280_3$, and a resistor $272_4$ extends from terminal $252_2$ to a node $280_4$. A capacitor $268_1$ of a set 268 of capacitors is coupled between terminal $252_1$ and node $280_2$, a capacitor $268_2$ is coupled between terminal $252_1$ and node $280_3$, a capacitor $268_3$ is coupled between terminal $252_2$ and node $280_4$, and a capacitor $268_4$ is coupled between terminal $252_2$ and node $280_1$. Also in FIG. 2B, a resistor $272_5$ of set 272 of resistors is coupled from node $280_1$ to terminal $254_{11}$, a resistor $272_6$ is coupled from node $280_2$ to terminal $254_{21}$, a resistor $272_7$ is coupled from node $280_3$ to terminal $254_{12}$, and a resistor $272_8$ is coupled from node $280_4$ to terminal $254_{22}$. A capacitor $268_5$ of set 268 of capacitors is coupled between node $280_1$ and terminal $254_{21}$, a capacitor $268_6$ is coupled between node $280_2$ and terminal $254_{12}$, a capacitor $268_7$ is coupled between node $280_3$ and terminal $254_{22}$, and a capacitor $268_8$ is coupled between node $280_4$ and terminal $254_{11}$.

The bandwidth of filter 250 of FIG. 2B is about 3:1. However, the attenuation or through loss is about 12 to 15 decibels (dB). Quadrature filters are desired which provide relatively low through loss or attenuation and broad bandwidth.

SUMMARY OF THE INVENTION

A quadrature filter network includes a differential quadrature all-pass filter defining an input port and a pair of output ports at which nominally mutually quadrature signals are generated. The mutually quadrature signals serve as inputs to a resistance/reactance filter defining a pair of input ports and at least one output port, wherein the pair of input ports of the resistance/reactance filter are coupled to the pair of output ports of the quadrature all-pass filter.

The output ports of the quadrature all-pass filter further define a first output port having an I− terminal and an I+ terminal, and a second output port having a Q− terminal and a Q+ terminal. The input ports of the resistance/reactance filter define a first input port having an I− terminal and an I+ terminal, and a second input port having a Q− terminal and a Q+ terminal.

The I− output terminal of the quadrature all-pass filter is connected to the I− input terminal of the resistance/reactance filter. The I+ output terminal of the quadrature all-pass filter is connected to the I+ input terminal of the resistance/reactance filter. The Q− output terminal of the quadrature all-pass filter is connected to the Q+ input terminal of the resistance/reactance filter. The Q+ output terminal of the quadrature all-pass filter is connected to the Q− input terminal of the resistance/reactance filter.

In one embodiment, a phase-shifter includes a quadrature all-pass filter and a poly-phase filter. The quadrature all-pass filter is configured to receive a radio frequency signal and output I and Q outputs. The I output further defines an I− output terminal and an I+ output terminal, while the Q output further defines a Q− output terminal and a Q+ output terminal.

The poly-phase filter circuit is coupled to the quadrature all-pass filter circuit. The poly-phase filter circuit includes an I− input terminal, an I+ input terminal, a Q− input terminal and a Q+ input terminal. The poly-phase filter circuit is configured to receive the output of the quadrature all-pass filter circuit as inputs. The I− output terminal of the quadrature all-pass filter circuit is coupled to the I− input terminal of the poly-phase filter circuit. The I+ output terminal of the quadrature all-pass filter circuit is coupled to the I+ input terminal of the poly-phase filter circuit. The Q− output terminal of the quadrature all-pass filter circuit is coupled to the Q+ input terminal of the poly-phase filter circuit. The Q+ output terminal of the quadrature all-pass filter circuit is coupled to the Q− input terminal of the poly-phase filter circuit.

DETAILED DESCRIPTION OF THE INVENTION

Figure 1:
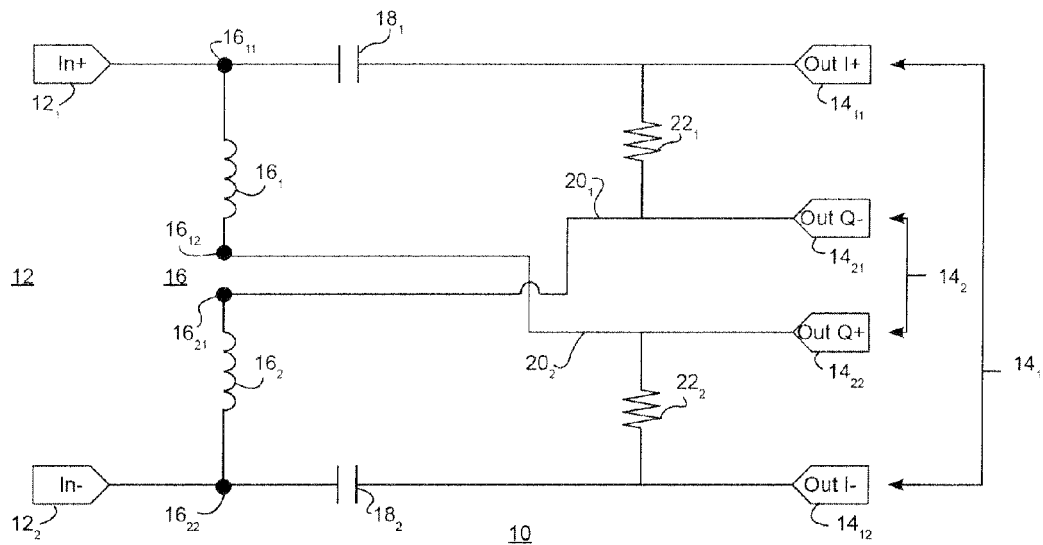
FIG. 1 is a simplified schematic diagram of a prior-art differential quadrature all-pass filter or phase shifter.
Figure 2A:
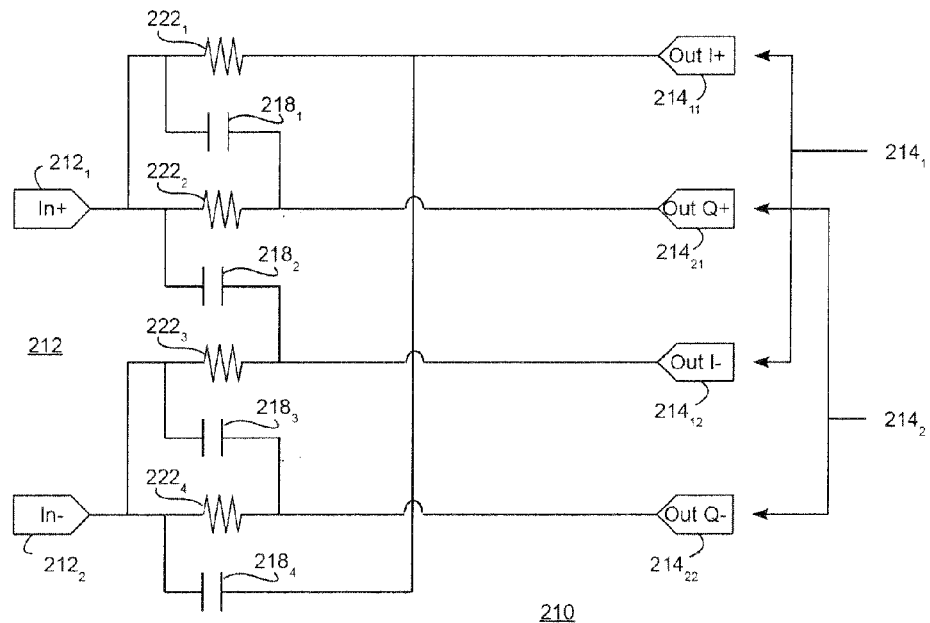
FIG. 2A is a simplified schematic diagram of a prior-art single-pole polyphase filter.
Figure 2B:
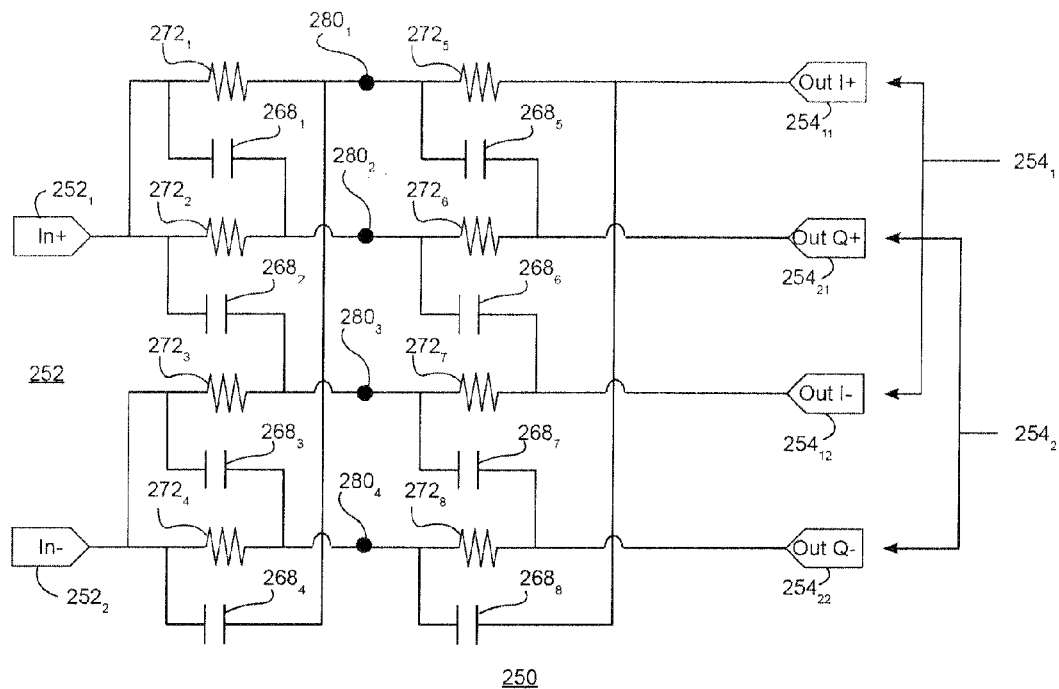
FIG. 2B is a simplified schematic diagram of a prior-art two-pole polyphase filter.
Figure 3A:
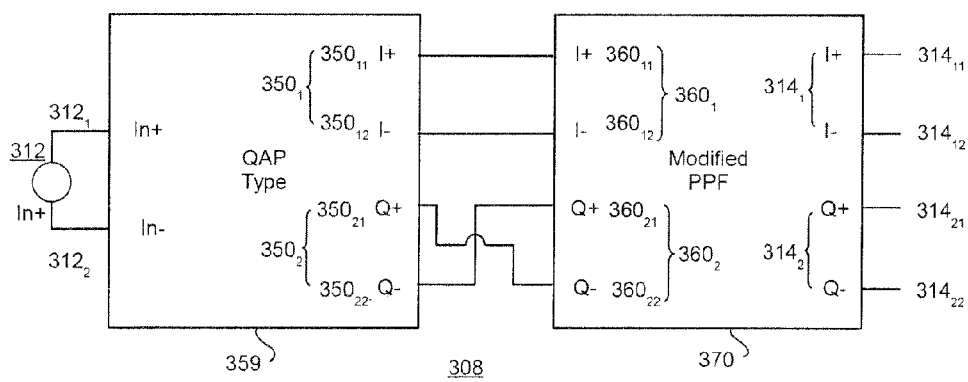
FIG. 3A is a simplified conceptual block diagram of a filter according to an aspect of the disclosure.

FIG. 3A is a simplified block diagram illustrating a network or filter 308 according to an aspect of the disclosure. In FIG. 3A, a block 359 represents a differential quadrature all-pass filter (QAF) or network. Block or network 359 includes a balanced input port 312 with + and − terminals, ports, electrodes or conductors $312_1$ and $312_2$, respectively. QAF block 359 also comprises first and second balanced output ports $350_1$ and $350_2$, where balanced output port $350_1$ is the I port and balanced output port $350_2$ is the Q port. Output port $350_1$ has I+ or first terminal $350_{11}$ and I− or second terminal $350_{12}$, respectively. Output port $350_2$ has Q+ or first terminal $350_{21}$ and Q− or second terminal $350_{22}$.

Network 308 of FIG. 3A also includes a modified polyphase filter section (PPF) 370. PPF 370 includes first and second balanced input ports $360_1$ and $360_2$, respectively. Input port $360_1$ comprises I+ or first terminal $360_{11}$ and I− or second terminal $360_{12}$. Input port $360_2$ defines Q+ terminal $360_{21}$ and Q− terminal $360_{22}$. PPF 370 also has an I output port $314_1$ and a Q output port $314_2$. I output port $314_1$ comprises I+ terminal $314_{11}$ and I− terminal $314_{12}$, and Q output port $314_2$ comprises Q+ terminal $314_{21}$ and Q− terminal $314_{22}$. As illustrated in FIG. 3A, I+ output terminal $350_{11}$ of QAF 359 is connected to I+ input terminal $360_{11}$ of PPF 370. I− output terminal $350_{12}$ of QAF 359 is connected to I− input terminal $360_{12}$ of PPF filter 370. Q+ output terminal $350_{21}$ of QAF filter 359 is connected to Q− terminal $360_{22}$ of PPF filter 370, and Q− output terminal $350_{22}$ is connected to Q+ input terminal $360_{21}$ of PPF filter 370.

Figure 3B:
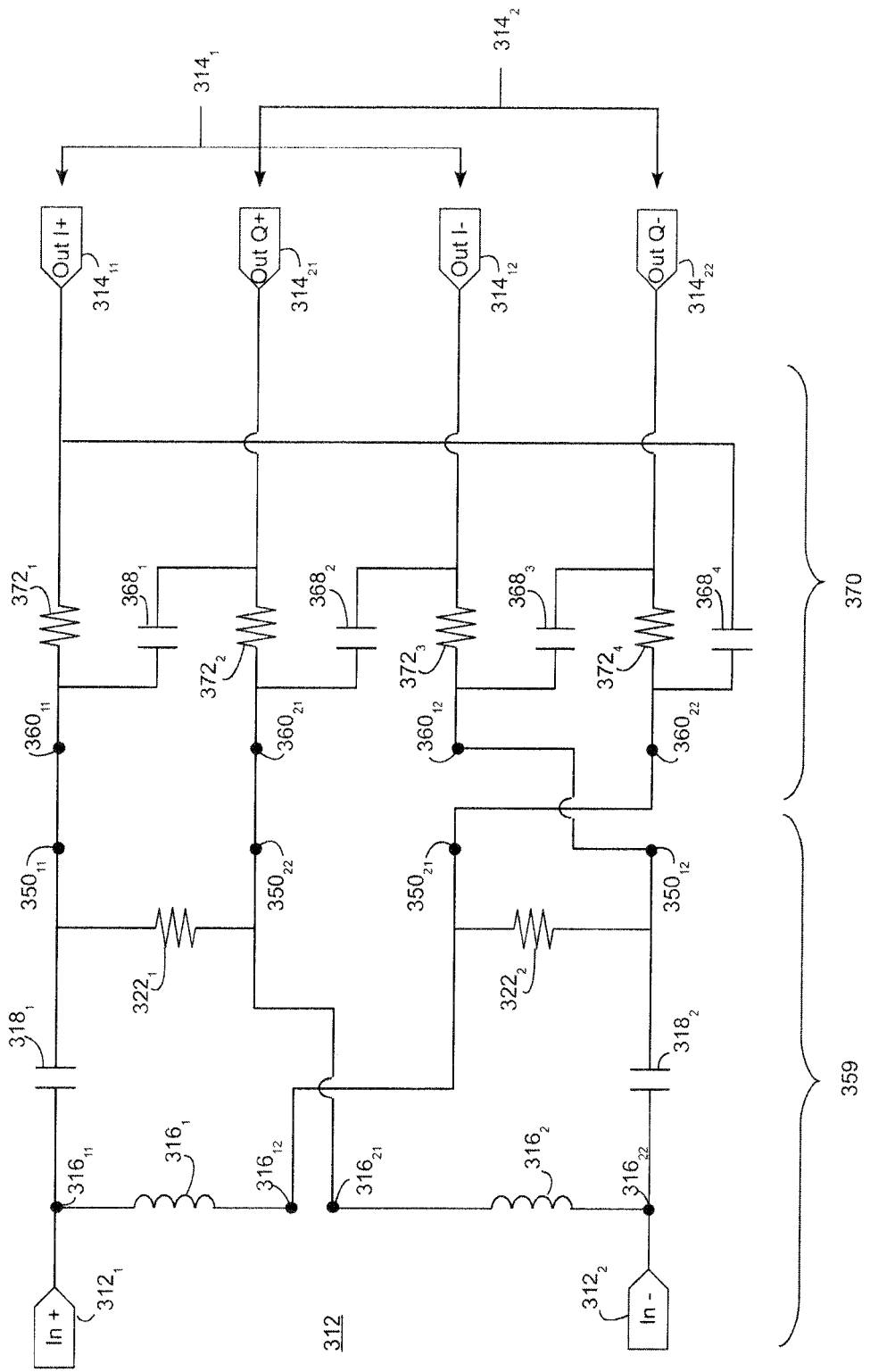
FIG. 3B is a corresponding schematic diagram.

FIG. 3B illustrates some details of a phase shifter according to an aspect of the disclosure. Elements of FIG. 3B corresponding to those of FIG. 3A are designated by like reference alphanumerics. In filter portion 359 of FIG. 3B, an inductor $316_1$ is coupled between terminal or node $312_1$ and terminal or node $350_{21}$, and an inductor $316_2$ is coupled between terminal or node $312_2$ and terminal or node $350_{22}$. A capacitor $318_1$ is coupled between terminal $312_1$ and node $350_{11}$, and a capacitor $318_2$ is coupled between terminal $312_2$ and node $350_{12}$. A resistor $322_1$ is connected between nodes $350_{11}$ and $350_{22}$, and a resistor $322_2$ is connected between nodes $350_{21}$ and $350_{12}$. The outputs at nodes $350_{11}$, $350_{12}$, $350_{21}$, and $350_{22}$ represent the I+, I−, Q+, and Q− signals, respectively, from filter portion 359.

Also in FIG. 3B, filter portion 370 includes a resistor $372_1$ connected between terminal or node $360_{11}$ and terminal $314_{11}$, a resistor $372_2$ connected between terminal or node $360_{21}$ and terminal $314_{21}$, a resistor $372_3$ connected between terminal or node $360_{12}$ and terminal $314_{12}$, and a resistor $372_4$ connected between terminal or node $360_{22}$ and terminal $314_{22}$. Also, a capacitor $368_1$ is connected between terminal or node $360_{11}$ and terminal $314_{21}$, a capacitor $368_2$ is connected between terminal or node $360_{21}$ and terminal $314_{12}$, a capacitor $368_3$ is connected between terminal or node $360_{12}$ and terminal $314_{22}$, and a capacitor $368_4$ is connected between terminal or node $360_{22}$ and terminal $314_{11}$. The output I+ at terminal $314_{11}$ represents zero (0) degree phase shift. The output I− at terminal $314_{12}$ represents +180 degree phase shift. The output Q+ at terminal $314_{21}$ represents +90 degree phase shift. And the output Q− at terminal $314_{22}$ represents +270 degree phase shift.

In the arrangement of FIG. 3B, the element values are as follows. The values of inductors $316_1$ and $316_2$ are the same, namely 621 picohenries (pH). The capacitors $318_1$ and $318_2$ are of the same value, namely 612 femtofarads (fF). Resistors $322_1$ and $322_2$ both have a value of 63 ohms. Resistors $372_1$, $372_2$, $372_3$, and $372_4$ are each 84 ohms. Capacitors $368_1$, $368_2$, $368_3$, and $368_4$ are each 71.8 fF. With these values, the bandwidth is 7 to 22 gigahertz (GHz) without optimization, and optimized embodiments have achieved a bandwidth extending from about 5 to 25 GHz. The through loss is about 7 dB. Thus, the disclosed arrangement provides bandwidth equal to or better than the two-pole polyphase filter of the prior art, with losses which are improved (reduced) by about 5 to 8 dB. By comparison with the 2:1 bandwidth of the differential quadrature all-pass filter, the bandwidth of the disclosed arrangement is, or at least can be, more than 3:1 and as much as 5:1. The through loss of 7 dB is only about two dB worse than the QAF.

Thus, a quadrature filter network (308) according to an aspect of the disclosure comprises a differential quadrature all-pass filter (359) defining an input port (312) and a pair of output ports ($350_1$, $350_2$) at which nominally mutually quadrature signals are generated. The quadrature filter also comprises a resistance-reactance filter (370). The resistance-reactance filter (370) defines a pair of input ports ($360_1$, $360_2$), and also defines at least an output port. The pair of input ports ($360_1$, $360_2$) of the resistance-reactance filter (370) is coupled to the pair of output ports ($350_1$, $350_2$) of the differential quadrature all-pass filter (359). In one embodiment, the output ports of the differential quadrature all-pass filter and the input ports of the resistance-reactance filter are balanced.

A phase shifter (308) according to another aspect of the disclosure comprises a differential filter (359) coupled to a polyphase filter (370). The differential filter (359) defines a balanced input port (312) and first ($350_1$) and second ($350_2$) balanced intermediate or output ports. The balanced input port (312) defines first ($312_1$) and second ($312_2$) terminals. The first ($350_1$) balanced intermediate port defines first ($350_{11}$) and second ($350_{12}$) intermediate nodes, and the second ($350_2$) balanced intermediate port defines first ($350_{21}$) and second ($350_{22}$) intermediate nodes. The differential filter (359) further comprises a first capacitor ($318_1$) coupled from the first terminal ($312_1$) of the balanced input port (312) to the first node ($350_{11}$) of the first intermediate port ($350_1$), an inductor ($316_1$) coupled from the first terminal ($312_1$) of the balanced input port (312) to the first node ($350_{21}$) of the second intermediate port ($350_2$), and a resistor ($322_1$) coupled from the first intermediate node ($350_{11}$) of the first intermediate port ($350_1$) to the second intermediate node ($350_{22}$) of the second intermediate port ($350_2$). The differential filter (359) further comprises a second capacitor ($318_2$) coupled from the second terminal ($312_2$) of the balanced input port (312) to the second intermediate node ($350_{12}$) of the first intermediate port ($350_1$), an inductor ($316_2$) coupled from the second terminal ($312_2$) of the balanced input port (312) to the second node ($350_{22}$) of the second intermediate port ($350_2$), and a resistor ($322_2$) coupled from the first intermediate node ($350_{21}$) of the second intermediate port ($350_2$) to the second node ($350_{12}$) of the first intermediate port ($350_1$). The polyphase filter (370) comprises first ($360_1$) and second ($360_2$) balanced input ports and first ($314_1$) and second ($314_2$) balanced output ports. The first balanced input port ($360_1$) of the polyphase filter (370) defines first ($360_{11}$) and second ($360_{12}$) nodes, and the second balanced input port ($360_2$) of the polyphase filter (370) defines first ($360_{21}$) and second ($360_{22}$) nodes. The first node ($360_{11}$) of the first balanced input port ($360_1$) of the polyphase filter (370) is coupled to the first intermediate node ($350_{11}$) of the first intermediate port ($350_1$) of the differential filter (359). The second intermediate node ($360_{12}$) of the first balanced input port ($360_1$) of the polyphase filter (370) is coupled to the second intermediate node ($350_{12}$) of the first intermediate or output port ($350_1$) of the differential filter (359). The first node ($360_{21}$) of the second balanced input port ($360_2$) of the polyphase filter (370) is coupled to the second intermediate node ($350_{22}$) of the second intermediate port ($350_2$) of the differential filter (359), and the second intermediate node ($360_{22}$) of the second balanced input port ($360_2$) of the polyphase filter (370) is coupled to the first intermediate node ($350_{21}$) of the second intermediate or output port ($350_2$) of the differential filter (359). The second node ($360_{12}$) of the first input port ($360_1$) of the polyphase filter (370) is coupled by a resistor ($372_3$) to the second terminal ($314_{12}$) of the first output port ($314_1$) of the polyphase filter (370). The first node ($360_{11}$) of the first input port ($360_1$) of the polyphase filter (370) is coupled by a resistor ($372_1$) to the first terminal ($314_{11}$) of the first output port ($314_1$) of the polyphase filter (370). The second node ($360_{22}$) of the second input port ($360_2$) of the polyphase filter (370) is coupled by a resistor ($372_4$) to the second terminal ($314_{22}$) of the second output port ($314_2$) of the polyphase filter (370). The first node ($360_{21}$) of the second input port ($360_2$) of the polyphase filter (370) is coupled by a resistor ($372_2$) to the first terminal ($314_{21}$) of the second output port ($314_2$), of the polyphase filter (370). The second node ($360_{12}$) of the first input port ($360_1$) of the polyphase filter (370) is coupled by a capacitor ($368_3$) to the second terminal ($314_{22}$) of the second output port ($314_2$) of the polyphase filter (370). The first node ($360_{11}$) of the first input port ($360_1$) of the polyphase filter (370) is coupled by a capacitor ($368_1$) to the first terminal ($314_{21}$) of the second output port ($314_2$) of the polyphase filter (370). The second node ($360_{22}$) of the second input port ($360_2$) of the polyphase filter (370) is coupled by a capacitor ($368_4$) to the first terminal ($314_{11}$) of the first output port ($314_1$) of the polyphase filter (370), and the first node ($360_{21}$) of the second input port ($360_2$) of the polyphase filter (370) is coupled by a capacitor ($368_2$) to the second terminal ($314_{12}$) of the first output port ($314_1$) of the polyphase filter (370). In a particular embodiment of the phase shifting network (308), each of the capacitors of the differential filter (359) has a value near 612 femtofarads (fF), or each of the inductors of the differential filter (359) has a value near 621 picohenries (pH), or each of the resistors of the differential filter (359) has a value near 63 ohms. In a particular embodiment, each of the capacitors of the polyphase filter (370) has a value near 72 fF, or each of the resistors of the polyphase filter (370) has a value near 84 ohms.

What is claimed is:

1. A quadrature filter network comprising:
    a differential quadrature all-pass filter defining an input port and a pair of output ports comprising a first output port having an output I+ terminal, and an output I− terminal and a second output port having an output Q+ terminal, and an output Q− terminal, at which nominally mutually quadrature signals are generated;
    a resistance-reactance filter defining a pair of input ports, comprising a first input port having an input I+ terminal, and an input I− terminal; and a second input port having an input Q+ terminal, and an input Q− terminal and also defining at least an output port, said pair of input ports of said resistance-reactance filter being coupled to said pair of output ports of said differential quadrature all-pass filter, and
    wherein the input I+ terminal of the resistance reactance filter is connected to the output I+ terminal of the quadrature all-pass filter;
    the input I− terminal of the resistance reactance filter is connected to the output I− terminal of the quadrature all-pass filter;
    the input Q+ terminal of the resistance reactance filter is connected to the output Q− terminal of the quadrature all-pass filter; and
    the input Q− terminal of the resistance reactance filter is connected to the output Q+ terminal of the quadrature all-pass filter.

2. The quadrature filter network of claim 1, wherein said output ports of said differential quadrature all-pass filter and said input ports of said resistance-reactance filter are balanced.

3. A phase-shifter comprising:
    a quadrature all-pass (QAP) filter circuit configured to receive a radio frequency input signal at an In+ terminal and at an In− terminal and configured to output I and Q outputs, wherein the I output is output at an I+ output terminal and at an I− output terminal, and the Q output is output at a Q+ output terminal and a Q− output terminal;
    a poly-phase filter (PPF) circuit coupled to said QAP filter circuit, the PPF circuit having:
    I and Q input ports, the I input port having an I+ input terminal and an I− input terminal; and the Q input port having a Q+ input terminal and a Q− input terminal; and
    I and Q output ports, the I output port having an I+ output terminal and an I− output terminal; and the Q output port having a Q+ output terminal and a Q− output terminal;
    wherein the PPF circuit is configured to receive the I and Q outputs of the QAP filter circuit at the I and Q input ports of the PPF circuit,
    wherein the I+ output terminal of the QAP filter circuit is coupled to the I+ input terminal of the PPF circuit, the I− output terminal of the QAP filter circuit is coupled to the I− input terminal of the PPF, the Q+ output terminal of the QAP filter is coupled to the Q− input terminal of the PPF circuit, and the Q− output terminal of the QAP filter circuit is coupled to the Q+ input terminal of the PPF circuit.

4. The phase-shifter of claim 3, wherein the QAP filter circuit comprises an inductive/capacitive filter.

5. The phase-shifter of claim 3, wherein the PPF filter circuit comprises a resistance-reactance circuit.

6. The phase-shifter of claim 3, wherein the input terminals of the QAP filter circuit are balanced.

7. A method of producing a quadrature phase shifted radio frequency signal comprising:
    receiving a radio frequency input signal at a differential quadrature all-pass (QAP) filter circuit;
    outputting from the QAP circuit, mutually quadrature signals at an I output at an I+ terminal and an I− terminal, and a Q output at a Q+ terminal and a Q− terminal;
    coupling the I+ terminal to an I+ input terminal of a poly-phase filter (PPF) circuit; and coupling the I− terminal to an I− input terminal of the PPF circuit;
    coupling the Q+ terminal to a Q− input terminal of the PPF circuit; and coupling the Q− terminal to a Q+ input terminal of the PPF circuit;
    outputting from the PPF circuit, mutually quadrature signals at an I output from an I+ output terminal and an I− output terminal, and a Q output from a Q+ output terminal and a Q− output terminal.

8. The method of claim 7, wherein said output ports of said differential quadrature all-pass filter and said input ports of said PPF circuit are balanced.

* * * * *